US012751134B2

(12) United States Patent
Wu

(10) Patent No.: US 12,751,134 B2
(45) Date of Patent: Sep. 29, 2026

(54) DISPLAY PANELS AND DISPLAY DEVICES

(71) Applicant: WUHAN CHINA STAR OPTOELECTRONICS SEMICONDUCTOR DISPLAY TECHNOLOGY CO., LTD., Wuhan (CN)

(72) Inventor: Kailong Wu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 346 days.

(21) Appl. No.: 18/697,457

(22) PCT Filed: Feb. 27, 2024

(86) PCT No.: PCT/CN2024/078690

§ 371 (c)(1),
(2) Date: Mar. 30, 2024

(87) PCT Pub. No.: WO2025/152232

PCT Pub. Date: Jul. 24, 2025

(65) Prior Publication Data

US 2026/0157031 A1 Jun. 4, 2026

(30) Foreign Application Priority Data

Jan. 16, 2024 (CN) ......................... 202410063041.9

(51) Int. Cl.
*H10K 50/18* (2023.01)
*H10K 50/15* (2023.01)
(Continued)

(52) U.S. Cl.
CPC ........... *H10K 50/181* (2023.02); *H10K 50/15* (2023.02); *H10K 50/19* (2023.02); *H10K 59/352* (2023.02);
(Continued)

(58) Field of Classification Search
CPC .... H10K 50/15; H10K 50/156; H10K 50/181; H10K 50/19; H10K 50/805; H10K 50/81;
(Continued)

(56) References Cited

U.S. PATENT DOCUMENTS 9,997,739 B2 * 6/2018 Song ...................... H10K 59/32

FOREIGN PATENT DOCUMENTS

CN 103915569 A 7/2014
CN 111725412 A 9/2020
(Continued)

OTHER PUBLICATIONS

International Search Report in International application No. PCT/CN2024/078690,mailed on Aug. 9, 2024.
(Continued)

*Primary Examiner* — Cheung Lee
(74) *Attorney, Agent, or Firm* — PV IP PC; Wei Te Chung

(57) ABSTRACT

A display panel and a display device are disclosed in the embodiments of the present disclosure. The display panel of the embodiments of the present disclosure saves an electron blocking layer between at least one of the third light emitting unit and the first hole transport layer as well as the second light emitting unit and the first hole transport layer, by increasing the thickness of the first hole transport layer, while the decrease in luminous efficiency of the light emitting devices corresponding to the second light emitting unit and/or the third light emitting unit is avoided, masks can be saved and process steps can be simplified.

20 Claims, 7 Drawing Sheets

(51) Int. Cl.
*H10K 50/19* (2023.01)
*H10K 59/00* (2023.01)
*H10K 59/35* (2023.01)
*H10K 102/00* (2023.01)

(52) U.S. Cl.
CPC ..... *H10K 59/771* (2023.02); *H10K 2102/351* (2023.02)

(58) Field of Classification Search
CPC ...... H10K 50/816; H10K 50/82; H10K 59/10; H10K 59/19; H10K 59/30; H10K 59/32; H10K 59/35; H10K 59/352; H10K 59/771; H10K 59/805; H10K 59/8051; H10K 2102/351
See application file for complete search history.

(56) References Cited

FOREIGN PATENT DOCUMENTS

| | | | |
|---|---|---|---|
| CN | 114678392 | A | 6/2022 |
| KR | 20200029853 | A | 3/2020 |

OTHER PUBLICATIONS

Written Opinion of the International Search Authority in International application No. PCT/CN2024/078690,mailed on Aug. 9, 2024.

* cited by examiner

DISPLAY PANELS AND DISPLAY DEVICES

CROSS REFERENCE TO RELATED APPLICATIONS

This application is a US national phase application based upon an International Application No. PCT/CN2024/078690, filed on Feb. 27, 2024, which claims priority to Chinese Patent Application No. 202410063041.9, filed on Jan. 16, 2024, and entitled "Display Panels and Display Devices". The entire disclosures of the aforementioned applications are incorporated herein by reference in their entireties.

TECHNICAL FIELD

The present disclosure relates to display technologies, and in particular, to display panels and display devices.

BACKGROUND

In related technologies, a tandem device refers to a device structure that uses a charge generation layer (CGL) to connect multiple light emitting units. The CGL at least contains a P-CGL layer with high hole mobility and an N-CGL layer with high electron mobility. The tandem device has characteristics of high efficiency and high luminance lifetime, but the complexity of the device structure and the difficulty of the production process increase significantly. Compared with the single-layered device, 11 film layers are newly added in the double-layered tandem device directly built by stacking single-layered devices. Each of the single-layered devices corresponding to each color (red/green/blue, R/G/B) is provided with an electron blocking layer to improve the luminous efficiency of light with different colors. Compared with the current single-layered device, multiple metal masks for common layers and light emitting layers are required, so that the complexity of device structure and process of this double-layered tandem device is greatly increased, and the production cost is also increased significantly.

SUMMARY

Embodiments of the present disclosure provide a display panel and a display device, which can save a part of the electron blocking layer without reducing the luminous efficiency of the display panel, thereby saving masks and related process steps.

In one aspect, an embodiment of the present disclosure provides a display panel including:

a substrate;

a first conductive layer disposed on the substrate, and the first conductive layer includes a plurality of first electrodes, a plurality of second electrodes, and a plurality of third electrodes;

a first hole transport layer disposed on the first conductive layer;

a first electron blocking layer disposed on the first hole transport layer, the first electron blocking layer includes: a first electron blocking portion disposed corresponding to the plurality of first electrodes;

a first light emitting layer disposed on the first electron blocking layer, and the first light emitting layer includes: a first light emitting unit disposed corresponding to the plurality of first electrodes, a second light emitting unit disposed corresponding to the plurality of second electrodes, and a third light emitting unit disposed corresponding to the plurality of third electrodes;

a charge generation layer disposed on the first light emitting layer;

a second hole transport layer disposed on the charge generation layer, and a thickness of the second hole transport layer is less than a thickness of the first hole transport layer;

a second electron blocking layer disposed on the second hole transport layer, and the second electron blocking layer includes: a fourth electron blocking portion disposed corresponding to the plurality of first electrodes, a fifth electron blocking portion disposed corresponding to the plurality of second electrodes, and a sixth electron blocking portion disposed corresponding to the plurality of third electrodes;

a second light emitting layer disposed on the second electron blocking layer, and the second light emitting layer includes: a fourth light emitting unit disposed corresponding to the plurality of first electrodes, a fifth light emitting unit disposed corresponding to the plurality of second electrodes, and a sixth light emitting unit disposed corresponding to the plurality of third electrodes;

a second conductive layer disposed on the second light emitting layer;

and a side surface of the first hole transport layer away from the substrate is in direct contact with at least one of the second light emitting unit and the third light emitting unit.

In another aspect, an embodiment of the present disclosure further provides a display device including the display panel described in any of the above embodiments.

DETAILED DESCRIPTION

Figure 1:
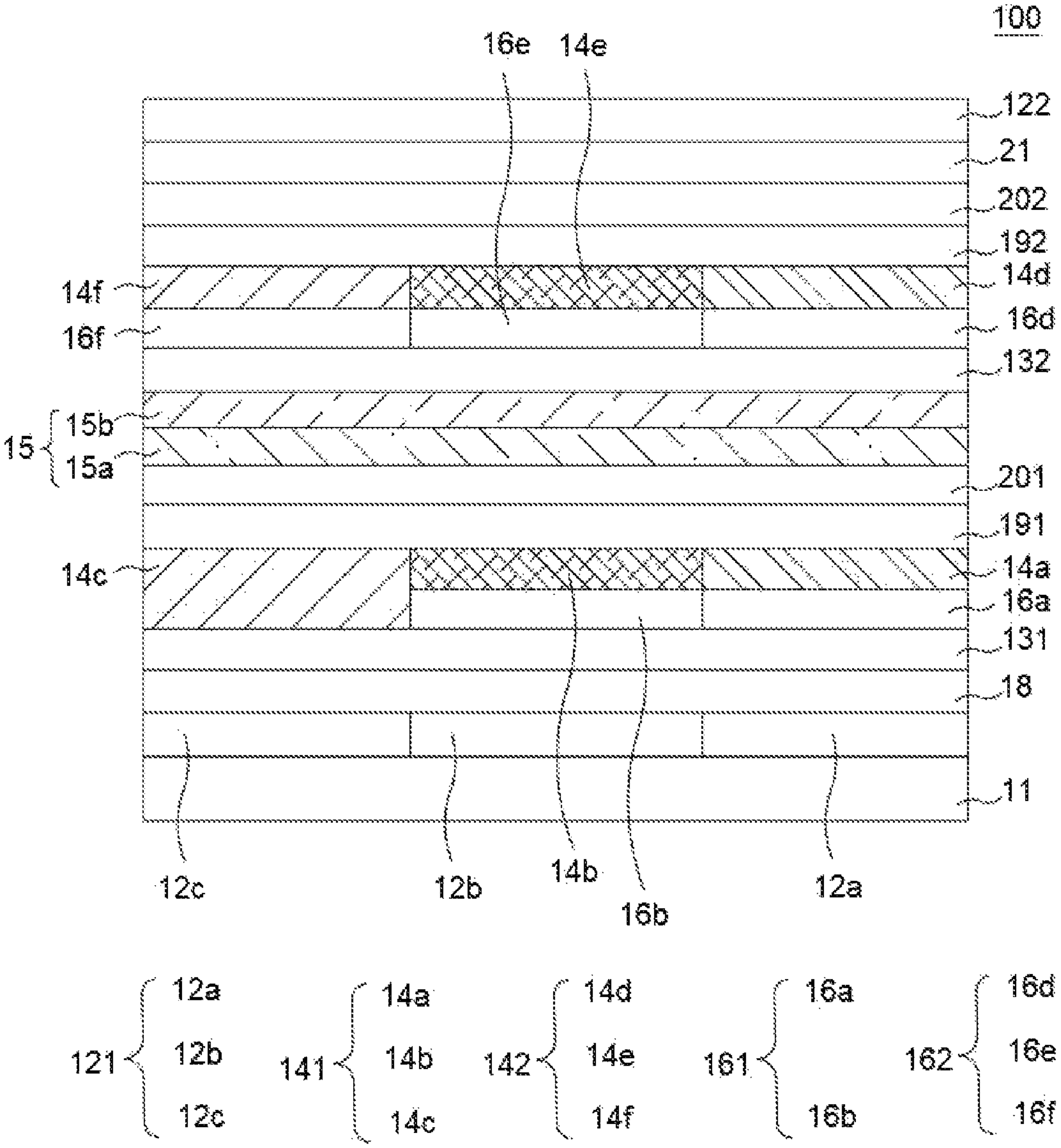
FIG. 1 is a schematic diagram of a structure of a display panel provided by an embodiment of the present disclosure.

Technical solutions in embodiments of the present disclosure will be clearly and completely described below with reference to the accompanying drawings in the embodiments of the present disclosure. It is apparent that the embodiments described herein are merely a part of the embodiments of the present disclosure, rather than all of the embodiments of the present disclosure. Based on the embodiments of the present disclosure, all other embodiments obtained by those skilled in the art without making creative efforts fall within the scope of protection of the present disclosure. In addition, it should be understood that the specific embodiments described herein are merely used to illustrate and explain the present disclosure, and are not intended to limit the present disclosure. In the present disclosure, unless otherwise specified, directional terms used herein, such as "upper" and "lower", generally refer to upper and lower positions of a device in actual use or working conditions, specifically refer to directions in the surfaces of the accompanying drawings. Terms "inside" and "outside" are for the contour of the device. Terms "first", "second", "third", and the like, are used merely as designators and do not impose numerical requirements or establish a sequence.

Embodiments of the present disclosure provide a display panel and a display device, which will be described in detail below. It should be noted that the order of description of the following embodiments does not limit the preferred order of the embodiments.

An embodiment of the present disclosure provides a display panel including:

a substrate;

a first conductive layer disposed on the substrate, and the first conductive layer includes a plurality of first electrodes, a plurality of second electrodes, and a plurality of third electrodes;

a first hole transport layer disposed on the first conductive layer;

a first electron blocking layer disposed on the first hole transport layer, the first electron blocking layer includes: a first electron blocking portion disposed corresponding to the plurality of first electrodes;

a first light emitting layer disposed on the first electron blocking layer, and the first light emitting layer includes: a first light emitting unit disposed corresponding to the plurality of first electrodes, a second light emitting unit disposed corresponding to the plurality of second electrodes, and a third light emitting unit disposed corresponding to the plurality of third electrodes;

a charge generation layer disposed on the first light emitting layer;

a second hole transport layer disposed on the charge generation layer, and a thickness of the second hole transport layer is less than a thickness of the first hole transport layer;

a second electron blocking layer disposed on the second hole transport layer, and the second electron blocking layer includes: a fourth electron blocking portion disposed corresponding to the plurality of first electrodes, a fifth electron blocking portion disposed corresponding to the plurality of second electrodes, and a sixth electron blocking portion disposed corresponding to the plurality of third electrodes;

a second light emitting layer disposed on the second electron blocking layer, and the second light emitting layer includes: a fourth light emitting unit disposed corresponding to the plurality of first electrodes, a fifth light emitting unit disposed corresponding to the plurality of second electrodes, and a sixth light emitting unit disposed corresponding to the plurality of third electrodes;

a second conductive layer disposed on the second light emitting layer;

and a side surface of the first hole transport layer away from the substrate is in direct contact with at least one of the second light emitting unit and the third light emitting unit.

Optionally, in some embodiments of the present disclosure, an area of the first light emitting unit is greater than an area of the second light emitting unit and an area of the third light emitting unit.

Optionally, in some embodiments of the present disclosure, each of the first light emitting unit and the fourth light emitting unit displays a first color, each of the second light emitting unit and the fifth light emitting unit displays a second color, each of the third light emitting unit and the sixth light emitting unit displays a third color, and the first color, the second color, and the third color are different from each other.

Optionally, in some embodiments of the present disclosure, a third electron blocking portion is disposed between the third light emitting unit and the first hole transport layer, and the second light emitting unit is in direct contact with the side surface of the first hole transport layer away from the substrate.

Optionally, in some embodiments of the present disclosure, the third light emitting unit and the sixth light emitting unit are configured to emit red light, the second light emitting unit and the fifth light emitting unit are configured to emit green light, and a thickness of the fifth electron blocking portion is greater than or equal to 10 nanometers.

Optionally, in some embodiments of the present disclosure, a second electron blocking portion is disposed between the second light emitting unit and the first hole transport layer, and the third light emitting unit is in direct contact with the side surface of the first hole transport layer away from the substrate.

Optionally, in some embodiments of the present disclosure, the third light emitting unit and the sixth light emitting unit are configured to emit red light, the second light emitting unit and the fifth light emitting unit are configured to emit green light, and a thickness of the sixth electron blocking portion is greater than or equal to 50 nanometers.

Optionally, in some embodiments of the present disclosure, each of the third light emitting unit and the second light emitting unit is in direct contact with the side surface of the first hole transport layer away from the substrate.

Optionally, in some embodiments of the present disclosure, the third light emitting unit and the sixth light emitting unit are configured to emit red light, the second light emitting unit and the fifth light emitting unit are configured to emit green light, a thickness of the sixth electron blocking part is greater than or equal to 50 nanometers, and a thickness of the fifth electron blocking part is greater than or equal to 10 nanometers.

Optionally, in some embodiments of the present disclosure, the thickness of the first hole transport layer is between 30 nanometers and 35 nanometers, and the thickness of the second hole transport layer is between 20 nanometers and 25 nanometers.

Optionally, in some embodiments of the present disclosure, the charge generation layer includes an N-type charge generation layer and a P-type charge generation layer that are disposed on the first light emitting layer in sequence, the P-type charge generation layer includes an organic material with hole transport capability and a first doping material, the first doping material is selected from at least one of a metal oxide and an organic material with electron withdrawing property, and a weight percentage of the first doping material in the P-type charge generation layer is between 0.1% and 20%.

Optionally, in some embodiments of the present disclosure, the weight percentage of the first doping material in the P-type charge generation layer is between 3% and 13%, and a thickness of the P-type charge generation layer is between 5 nanometers and 50 nanometers.

Optionally, in some embodiments of the present disclosure, the N-type charge generation layer includes an organic material with electron transport capability and a second doping material, the second doping material is selected from at least one of a metal material and a metal salt material, and a weight percentage of the second doping material in the N-type charge generation layer is between 0.1% and 20%.

Optionally, in some embodiments of the present disclosure, the weight percentage of the second doping material in the N-type charge generation layer is between 0.1% and 10%, and a thickness of the N-type charge generation layer is between 5 nanometers and 50 nanometers.

Optionally, in some embodiments of the present disclosure, each of the first light emitting unit and the fourth light emitting unit is configured to emit blue light.

Optionally, in some embodiments of the present disclosure, the display panel further includes a hole injection layer, a first hole blocking layer, a first electron transport layer, a second hole blocking layer, a second electron transport layer and an electron injection layer;

the hole injection layer covers the first conductive layer, the first hole transport layer covers the hole injection layer, the first hole blocking layer covers the first light emitting layer, the first hole transport layer is disposed on a side of the charge generation layer close to the substrate and covers the first hole blocking layer, the second hole blocking layer covers the second light emitting layer, the second electron transport layer covers the second hole blocking layer, and the electron injection layer is disposed on a side of the second conductive layer close to the substrate and covers the second electron transport layer.

An embodiment of the present disclosure further provides a display device including the display panel described in any one of the above embodiments.

The display panel of the embodiments of the present disclosure saves an electron blocking layer between at least one of the third light emitting unit and the first hole transport layer as well as the second light emitting unit and the first hole transport layer, by increasing the thickness of the first hole transport layer, while the decrease in luminous efficiency of the light emitting devices corresponding to the second light emitting unit and/or the third light emitting unit is avoided, masks can be saved and process steps can be simplified.

Referring to FIG. 1, an embodiment of the present disclosure provides a display panel 100 including a substrate 11, a first conductive layer 121, a second conductive layer 122, a first hole transport layer 131, a second hole transport layer 132, a first light emitting layer 141, a second light emitting layer 142, a charge generation layer 15, a first electron blocking layer 161 and a second electron blocking layer 162.

The first conductive layer 121 is disposed on the substrate 11. The first conductive layer 121 includes a plurality of first electrodes 12*a*, a plurality of second electrodes 12*b*, and a plurality of third electrodes 12*c*. The first hole transport layer 131 is disposed on the first conductive layer 121.

The first electron blocking layer 161 is disposed on the first hole transport layer 131. The first electron blocking layer 161 includes: a first electron blocking portion 16*a* disposed corresponding to the plurality of first electrodes 12*a*.

The first light emitting layer 141 is disposed on the first electron blocking layer 161. The first light emitting layer 141 includes: a first light emitting unit 14*a* disposed corresponding to the plurality of first electrodes 12*a*, a second light emitting unit 14*b* disposed corresponding to the plurality of second electrodes 12*b*, and a third light emitting unit 14*c* disposed corresponding to the plurality of third electrodes 12*c*.

The charge generation layer 15 is disposed on the first light emitting layer 141. The second hole transport layer 132 is disposed on the charge generation layer 15. The thickness of the second hole transport layer 132 is less than the thickness of the first hole transport layer 131.

The second electron blocking layer 162 is disposed on the second hole transport layer 132. The second electron blocking layer 162 includes: a fourth electron blocking portion 16*d* disposed corresponding to the plurality of first electrodes 12*a*, a fifth electron blocking portion 16*e* disposed corresponding to the plurality of second electrodes 12*b*, and a sixth electron blocking portion 16*f* disposed corresponding to the plurality of third electrodes 12*c*.

The second light emitting layer 142 is disposed on the second electron blocking layer 162. The second light emitting layer 142 includes: a fourth light emitting unit 14*d* disposed corresponding to the plurality of first electrodes 12*a*, a fifth light emitting unit 14*e* disposed corresponding to the plurality of second electrodes 12*b*, and a sixth light emitting unit 14*f* disposed corresponding to the plurality of third electrodes 12*c*.

The second conductive layer 122 is disposed on the second light emitting layer 142.

The side surface of the first hole transport layer 131 away from the substrate 11 is in direct contact with at least one of the second light emitting unit 14*b* and the third light emitting unit 14*c*.

The display panel 100 of the embodiments of the present disclosure saves an electron blocking layer between at least one of the third light emitting unit 14*c* and the first hole transport layer 131 as well as the second light emitting unit 14*b* and the first hole transport layer 131, by increasing the thickness of the first hole transport layer 131, while the decrease in luminous efficiency of the light emitting devices corresponding to the second light emitting unit 14*b* and/or the third light emitting unit 14*c* is avoided, masks can be saved and process steps can be simplified.

Optionally, the first conductive layer 121 is an anode layer, and the second conductive layer 122 is a cathode layer.

Optionally, the substrate 11 is a driving substrate with a driving circuit, and the substrate 11 includes thin film transistors and signal lines. One electrode is correspondingly connected to a thin film transistor.

Optionally, a material of each of the first light emitting unit 14*a* to the sixth light emitting unit 14*f* is an organic light emitting material.

An area where the first light emitting unit 14*a* and the fourth light emitting unit 14*d* emitting light of a same color are stacked is a first light emitting region. An area where the third light emitting unit 14*c* and the sixth light emitting unit 14*f* emitting light of a same color are stacked is a third light emitting region. An area where the second light emitting unit 14*b* and the fifth light emitting unit 14*e* emitting light of a same color are stacked is a second light emitting region.

Each of the first light emitting region, the second light emitting region and third light emitting region emits light of a different color with each other. The third light emitting region is correspondingly provided with the plurality of third electrodes 12_c_, and the second light emitting region is correspondingly provided with the plurality of second electrodes 12_b_. That is, one kind of electrodes correspondingly drives one light emitting region.

That is, each of the first light emitting unit 14_a_ and the fourth light emitting unit 14_d_ displays a first color, each of the second light emitting unit 14_b_ and the fifth light emitting unit 14_c_ displays a second color, and each of the third light emitting unit 14_c_ and the sixth light emitting unit 14_f_ displays a third color. The first color, the second color, and the third color are different from each other.

Optionally, in one embodiment, the first light emitting region emits blue light. In addition, when the third light emitting region emits red light, the second light emitting region emits green light; and when the third light emitting region emits green light, the second light emitting region emits red light.

Optionally, the area of the first light emitting unit 14_a_ is greater than the area of the second light emitting unit 14_b_ and the area of the third light emitting unit 14_c_. Since the first light emitting unit 14_a_ emits blue light, the area of the first light emitting unit 14_a_ is set to increase the luminous brightness of the first light emitting unit 14_a_.

Optionally, the charge generation layer 15 includes an N-type charge generation layer 15_a_ and a P-type charge generation layer 15_b_ that are stacked in sequence. The first hole transport layer 131, the second hole transport layer 132, the N-type charge generation layer 15_a_, the P-type charge generation layer 15_b_ and the second conductive layer 122 are common layers That is, each of the first hole transport layer 131, the second hole transport layer 132, the N-type charge generation layer 15_a_, the P-type charge generation layer 15_b_ and the second conductive layer 122 is disposed in the whole-surface of the display region of the display panel 100.

In addition, the charge generation layer 15 is a charge generation composite structure with charge generation capability. It can be understood that the charge generation composite structure is connected and disposed between two adjacent light emitting units to form a stacked organic light emitting device. Each light emitting unit at least includes a hole transport layer and a light emitting layer.

Optionally, in one embodiment, the display panel 100 further includes a hole injection layer 18, a first hole blocking layer 191, a first electron transport layer 201, a second hole blocking layer 192, and a second electron transport layer 202 and an electron injection layer 21.

The hole injection layer 18 covers the first conductive layer 121. The first hole transport layer 131 covers the hole injection layer 18. The first hole blocking layer 191 covers the first light emitting layer 141. The first electron transport layer 201 is disposed on the side of the charge generation layer 15_a_ close to the substrate 11 and covers the first hole blocking layer 191. The second hole blocking layer 192 covers the second light emitting layer 142. The second electron transport layer 202 covers the second hole blocking layer 192. The electron injection layer 21 is disposed on the side of the second conductive layer 122 close to the substrate 11 and covers the second electron transport layer 202.

Optionally, each of the hole injection layer 18, the first hole blocking layer 191, the first electron transport layer 201, the second hole blocking layer 192, the second electron transport layer 202 and the electron injection layer 21 is also a common layer and is also disposed on the whole-surface of the display region of the display panel 100.

Optionally, in this embodiment, the P-type charge generation layer 15_b_ includes an organic material with hole transport capability and a first doping material. The first doping material is selected from at least one of a metal oxide and an organic material with electron-withdrawing property.

The weight percentage of the first doping material in the P-type charge generation layer 15_b_ is between 0.1% and 20%. For example, the weight percentage of the first doping material in the P-type charge generation layer 15_b_ can be 0.1%, 0.5%, 1%, 2%, 3%, 4%, 5%, 6%, 7%, 8%, 9%, 10%, 11%, 12%, 13%, 14%, 15%, 16%, 17%, 18%, 19% or 20%, and the like.

It can be understood that the P-type charge generation layer 15_b_ is used to achieve charge separation and transfer holes generated by charge separation to the sixth light emitting unit 14_f_, the fifth light emitting unit 14_c_, and the fourth light emitting unit 14_d_. The first doping material is configured to reduce the charge separation barrier, thereby reducing the voltage.

If the doped amount of the first doping material is too small, the purpose of reducing the charge separation barrier cannot be achieved, and if it is too much, the risk of electric leakage of the film layer increases. Therefore, the weight percentage of the first doping material in the P-type charge generation layer 15_b_ is between 0.1% and 20%, so that while reducing the charge separation barrier, the risk of electric leakage of the film layer can be reduced.

Further, in one embodiment, the weight percentage of the first doping material in the P-type charge generation layer 15_b_ is between 3% and 13%. The thickness of the P-type charge generation layer 15_b_ is between 5 nanometers and 50 nanometers. For example, the thickness of the P-type charge generation layer 15_b_ can be 5 nanometers, 10 nanometers, 20 nanometers, 25 nanometers, 30 nanometers, 35 nanometers, 40 nanometers, 45 nanometers or 50 nanometers and the like.

It can be understood that if the thickness of the P-type charge generation layer 15_b_ is too large, it will increase the risk of electric leakage of the film layer, and if it is too small, it will affect the device performance. Therefore, in order to better reduce the risk of electric leakage in the P-type charge generation layer 15_b_, reduce the charge separation barrier and ensure the performance of the light emitting device, the weight percentage of the first doping material in the P-type charge generation layer 15_b_ is selected as between 3% and 13%. The thickness of the P-type charge generation layer 15_b_ is between 5 nanometers and 50 nanometers.

Optionally, the first doping material may include at least one of $MoO_3$; $WO_3$; $V_2O_5$; $Fc_3O_4$; dipyrazino [2,3-f:2',3'-h] quinoxaline-2,3,6,7,10,11-hexacarbonitrile (HATCN); 2,3,5,6-tetrafluoro-7,7',8,8'-tetracyanoquinodimethane (F4TCNQ); and acetonitrile derivatives.

Optionally, in one embodiment, the N-type charge generation layer 15_a_ includes an organic material with electron transport capability and a second doping material. The second doping material is selected from at least one of a metal material and a metal salt material.

The weight percentage of the second doping material in the N-type charge generation layer 15_a_ is between 0.1% and 20%.

The weight percentage of the second doping material in the N-type charge generation layer 15_a_ is between 0.1% and 20%. For example, the weight percentage of the second doping material in the N-type charge generation layer 15_a_ can be 0.1%, 0.2%, 0.3%, 0.4%, 0.5%, 0.6%, 0.7%, 0.8%, 0.9%, 1%, 2%, 3%, 4%, 5%, 6%, 7%, 8%, 9%, 10%, 11%, 12%, 13%, 14%, 15%, 16%, 17%, 18%, 19% or 20%, and the like.

It can be understood that the N-type charge generation layer 15*a* is configured to achieve charge separation and transfer electrons generated by charge separation to the third light emitting unit 14*c*, the second light emitting unit 14*b*, and the first light emitting unit 14*a*. The second doping material is configured to reduce the charge separation barrier, thereby reducing the voltage.

If the doped amount of the second doping material is too small, the purpose of reducing the charge separation barrier cannot be achieved, and if it is too large, the risk of electric leakage of the film layer increases. Therefore, the weight percentage of the second doping material in the N-type charge generation layer 15*a* is between 0.1% and 20%, so that while reducing the charge separation barrier, the risk of electric leakage of the film layer can be reduced.

Further, in one embodiment, the weight percentage of the second doping material in the N-type charge generation layer 15*a* is between 0.1% and 10%. The thickness of the N-type charge generation layer 15*a* is between 5 nanometers and 50 nanometers. For example, the thickness of the N-type charge generation layer 15*a* can be 5 nanometers, 10 nanometers, 20 nanometers, 25 nanometers, 30 nanometers, 35 nanometers, 40 nanometers, 45 nanometers or 50 nanometers and the like.

It can be understood that if the thickness of the N-type charge generation layer 15*a* is too large, it will increase the risk of electric leakage of the film layer, and if it is too small, it will affect the device performance. Therefore, in order to better reduce the risk of electric leakage in the N-type charge generation layer 15*a*, reduce the charge separation barrier and ensure the performance of the light emitting device, the weight percentage of the second doping material in the N-type charge generation layer 15*a* is selected as between 0.1% and 10%. The thickness of the N-type charge generation layer 15*a* is between 5 nanometers and 50 nanometers.

Optionally, the second doping material may include at least one of the elemental lithium, elemental sodium, elemental potassium, elemental cesium, elemental magnesium, elemental calcium, elemental strontium, elemental barium, elemental ytterbium, lithium fluoride, sodium fluoride, lithium carbonate, cesium carbonate and lithium nitride.

Optionally, in one embodiment, referring to FIG. 1, a second electron blocking portion 16*b* is disposed between the second light emitting unit 14*b* and the first hole transport layer 131. The third light emitting unit 14*c* is in direct contact with the side surface of the first hole transport layer 131 away from the substrate 11.

In the embodiment illustrated in FIG. 1, the third light emitting unit 14*c* and the sixth light emitting unit 14*f* are configured to emit red light, and the second light emitting unit 14*b* and the fifth light emitting unit 14*e* are configured to emit green light. That is, the electron blocking layer between the third light emitting unit 14*c* and the first hole transport layer 131 is saved.

It can be understood that when the electron blocking layer between the third light emitting unit 14*c* and the first hole transport layer 131 is saved, the position of the third light emitting unit 14*c* will be lowered, causing the light emitting position of the third light emitting unit 14*c* to shift. Therefore, by increasing the thickness of the first hole transport layer 131, the light emitting position of the third light emitting unit 14*c* is compensated and risen, thereby reducing the risk of the light emitting position of the third light emitting unit 14*c* being shifted, so as to maintain or improve the luminous efficiency of the third light emitting unit 14*c*.

In addition, when the electron blocking layer between the third light emitting unit 14*c* and the first hole transport layer 131 is saved, the electron-hole balance at the third light emitting unit 14*c* is deviated when emitting light, so that the luminous efficiency of the third light emitting unit 14*c* is decreased. Therefore, by increasing the thickness of the first hole transport layer 131, the electron-hole balance at the third light emitting unit 14*c* when emitting light is compensated and increased, thereby reducing the risk of the electron-hole balance at the third light-emitting unit 14*c* when emitting light being deviated, so as to maintain or improve the luminous efficiency of the third light emitting unit 14*c*.

Optionally, in one embodiment, the thickness of the sixth electron blocking portion 16*f* is greater than or equal to 50 nanometers. For example, the thickness of the sixth electron blocking portion 16*f* can be 50 nanometers, 55 nanometers, 60 nanometers, 65 nanometers, 70 nanometers, 75 nanometers, 80 nanometers, 85 nanometers or 90 nanometers and the like.

It can be understood that when the electron blocking layer between the third light emitting unit 14*c* and the first hole transport layer 131 is saved, the luminescence chromaticity of the third light emitting region will decrease. Therefore, by increasing the thickness of the sixth electron blocking portion 16*f* of the third light emitting region, the optical microcavity length of the red light emitting device is compensated, thereby reducing the risk of chromaticity decrease in the third light emitting region.

Further, in order to better maintain the standard of the chromaticity of the luminous color of the third light emitting region, the thickness of the sixth electron blocking portion 16*f* is between 70 nanometers and 80 nanometers. For example, the thickness of the sixth electron blocking portion 16*f* can be 70 nanometers, 71 nanometers, 72 nanometers, 73 nanometers, or 73 nanometers, 74 nanometers, 75 nanometers, 76 nanometers, 77 nanometers, 78 nanometers, 79 nanometers or 80 nanometers, and the like.

Figure 2:
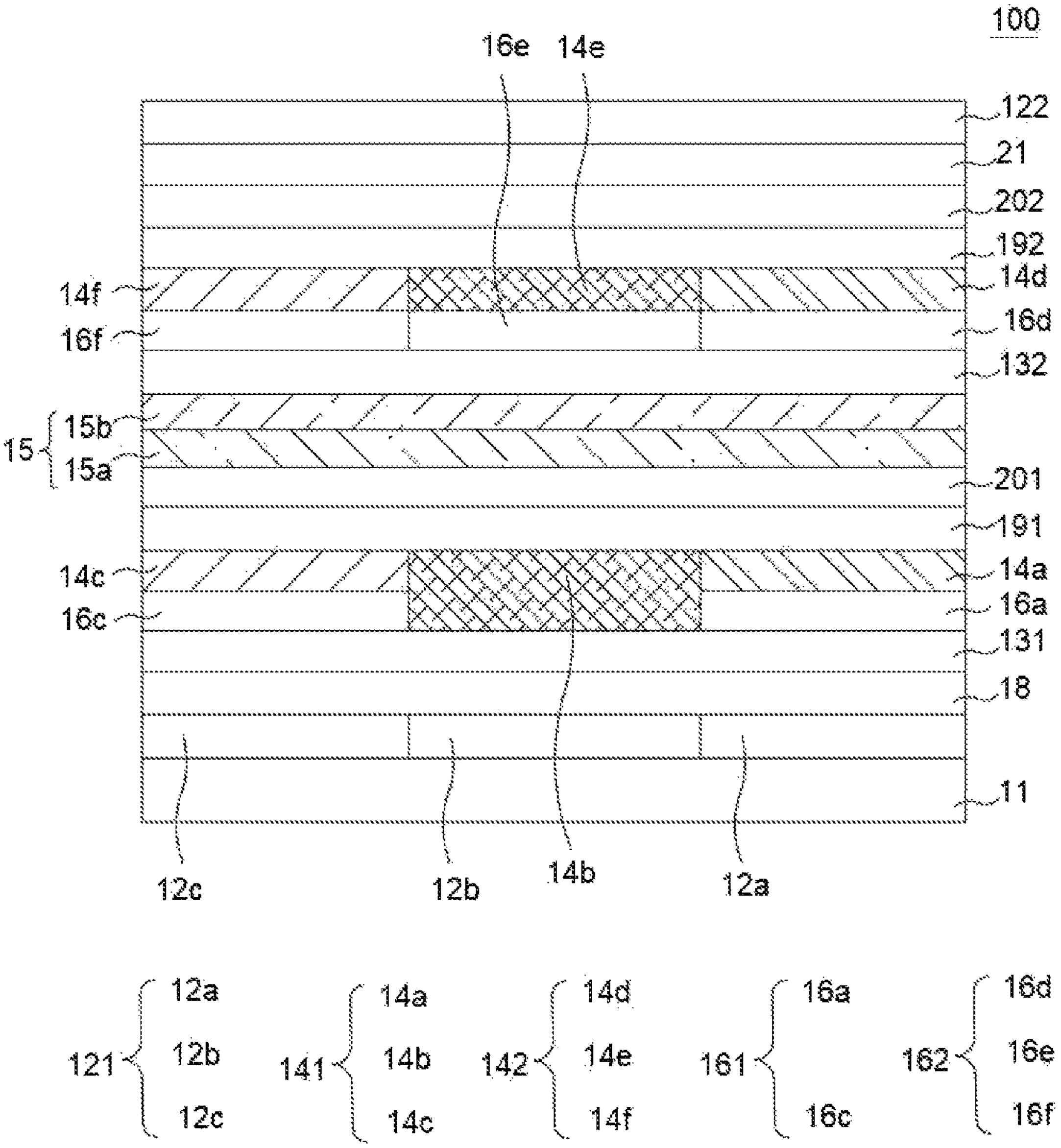
FIG. 2 is a schematic diagram of another structure of a display panel provided by an embodiment of the present disclosure.

Optionally, referring to FIG. 2, in one embodiment, a third electron blocking portion 16*c* is disposed between the third light emitting unit 14*c* and the first hole transport layer 131. The second light emitting unit 14*b* is in direct contact with the side surface of the first hole transport layer 131 away from the substrate 11.

The third light emitting unit 14*c* and the sixth light emitting unit 14*f* are configured to emit red light, and the second light emitting unit 14*b* and the fifth light emitting unit 14*e* are configured to emit green light. That is, the electron blocking layer between the second light emitting unit 14*b* and the first hole transport layer 131 is saved.

It can be understood that when the electron blocking layer between the second light emitting unit 14*b* and the first hole transport layer 131 is saved, the position of the second light emitting unit 14*b* will be lowered, causing the light emitting position of the second light emitting unit 14*b* to shift. Therefore, by increasing the thickness of the first hole transport layer 131, the light emitting position of the second light emitting unit 14*b* is compensated and risen, thereby reducing the risk of the light emitting position of the second light emitting unit 14*b* being shifted, so as to maintain or improve the luminous efficiency of the second light emitting unit 14*b*.

In addition, when the electron blocking layer between the second light emitting unit 14*b* and the first hole transport layer 131 is saved, the electron-hole balance at the second light emitting unit 14*b* is deviated when emitting light, so that the luminous efficiency of the second light emitting unit 14*b* is decreased. Therefore, by increasing the thickness of the first hole transport layer 131, the electron-hole balance at the second light emitting unit 14*b* when emitting light is compensated and increased, thereby reducing the risk of the electron-hole balance at the second light emitting unit 14*b* when emitting light being deviated, so as to maintain or improve the luminous efficiency of the second light emitting unit 14*b*.

Optionally, in one embodiment, the thickness of the fifth electron blocking portion 16*e* is greater than or equal to 10 nanometers. For example, the thickness of the fifth electron blocking portion 16*e* can be 10 nanometers, 15 nanometers, 20 nanometers, 25 nanometers, 30 nanometers, 35 nanometers, 40 nanometers, 45 nanometers or 50 nanometers and the like.

It can be understood that when the electron blocking layer between the second light emitting unit 14*b* and the first hole transport layer 131 is saved, the luminescence chromaticity of the second light emitting region will decrease. Therefore, by thickening the fifth electron blocking portion 16*e* of the second light emitting region, the optical microcavity length of the green light emitting device is compensated, thereby reducing the risk of chromaticity decrease in the second light emitting region.

Further, in order to better maintain the standard of the chromaticity of the luminous color of the second light emitting region, the thickness of the fifth electron blocking portion 16*e* is between 10 nanometers and 30 nanometers. For example, the thickness of the fifth electron blocking portion 16*e* can be 10 nanometers, 15 nanometers, 20 nanometers, 25 nanometers, or 30 nanometers and the like.

Figure 3:
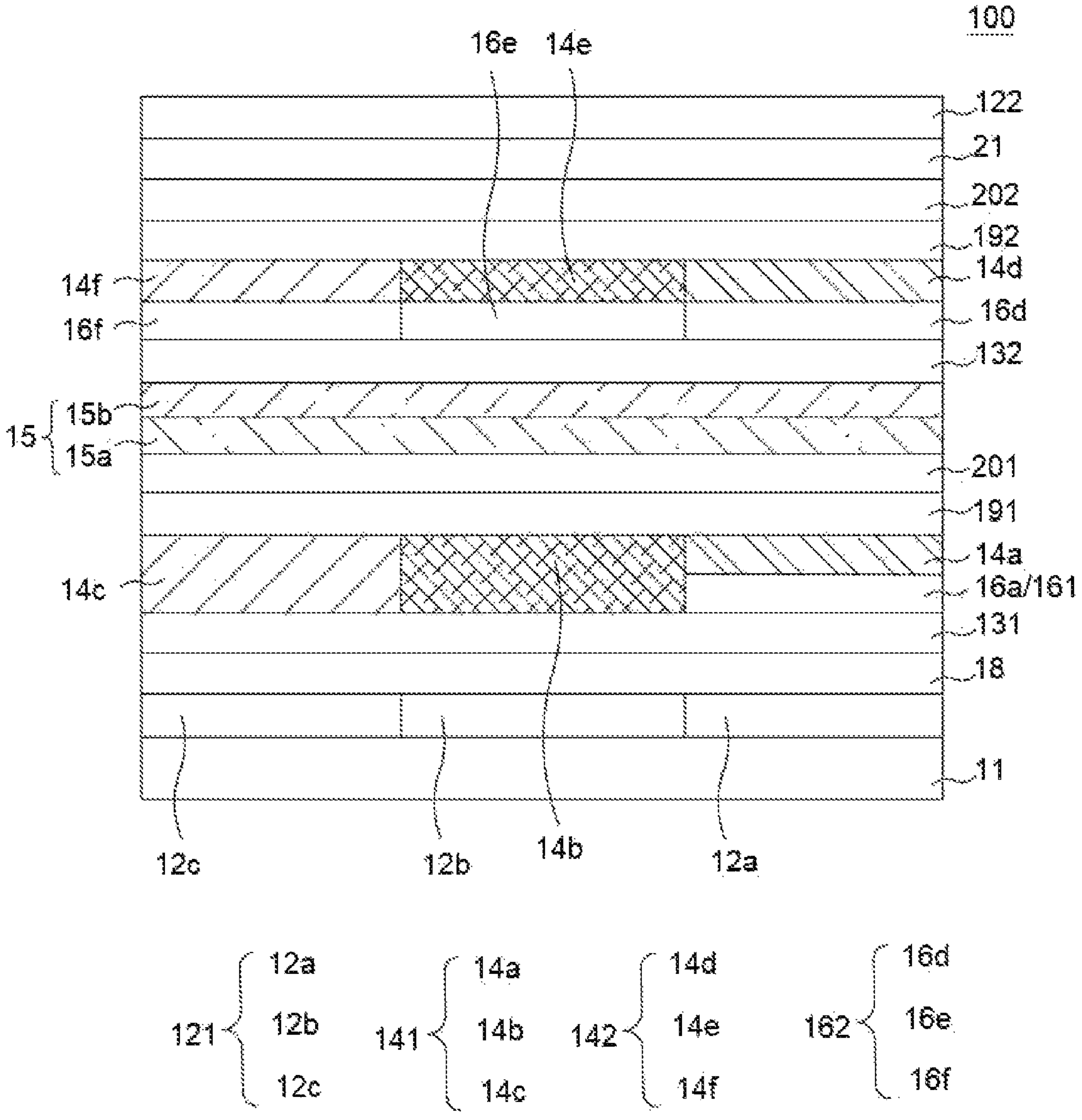
FIG. 3 is a schematic diagram of yet another structure of a display panel provided by an embodiment of the present disclosure.

Optionally, referring to FIG. 3, in one embodiment, each of the third light emitting unit 14*c* and the second light emitting unit 14*b* is in direct contact with the side surface of the first hole transport layer 131 away from the substrate 11.

In the embodiment illustrated in FIG. 3, the third light emitting unit 14*c* and the sixth light emitting unit 14*f* are configured to emit red light, and the second light emitting unit 14*b* and the fifth light emitting unit 14*e* are configured to emit green light. That is, the electron blocking layer between the third light emitting unit 14*c* and the first hole transport layer 131 is saved, and the electron blocking layer between the second light emitting unit 14*b* and the first hole transport layer 131 is also saved.

It can be understood that when the electron blocking layers between the third light emitting unit 14*c* and the first hole transport layer 131 as well as between the second light emitting unit 14*b* and the first hole transport layer 131 are saved, the positions of the third light emitting unit 14*c* and the second light emitting unit 14*b* will be lowered, causing the light emitting positions of the third light emitting unit 14*c* and the second light unit 14*b* to shift. Therefore, by increasing the thickness of the first hole transport layer 131, the light emitting positions of the third light emitting unit 14*c* and the second light emitting unit 14*b* are compensated and risen, thereby reducing the risk of the light emitting positions of the third light emitting unit 14*c* and the second light emitting unit 14*b* being shifted is reduced, so as to maintain or improve the luminous efficiency of the third light emitting unit 14*c* and the second light emitting unit 14*b*.

In addition, when the electron blocking layers between the third light emitting unit 14*c* and the first hole transport layer 131 as well as between the second light emitting unit 14*b* and the first hole transport layer 131 are saved, the electron-hole balance at the third light emitting unit 14*c* and the second light emitting unit 14*b* is deviated when emitting light, so that the luminous efficiency of the third light emitting unit 14*c* and the second light emitting unit 14*b* is decreased. Therefore, by increasing the thickness of the first hole transport layer 131, the electron-hole balance at the third light emitting unit 14*c* and the second light emitting unit 14*b* when emitting light is compensated and increased, thereby reducing the risk of the electron-hole balance at the third light-emitting unit 14*c* and the second light emitting unit 14*b* when emitting light being deviated, so as to maintain or improve the luminous efficiency of the third light emitting unit 14*c* and the second light emitting unit 14*b*.

Optionally, in one embodiment, the thickness of the fifth electron blocking portion 16*e* is greater than or equal to 10 nanometers. For example, the thickness of the fifth electron blocking portion 16*e* can be 10 nanometers, 15 nanometers, 20 nanometers, 25 nanometers, 30 nanometers, 35 nanometers, 40 nanometers, 45 nanometers or 50 nanometers and the like. The thickness of the sixth electron blocking portion 16*f* is greater than or equal to 50 nanometers. For example, the thickness of the sixth electron blocking portion 16*f* can be 50 nanometers, 55 nanometers, 60 nanometers, 65 nanometers, 70 nanometers, 75 nanometers, 80 nanometers, 85 nanometers or 90 nanometers and the like.

It can be understood that when the electron blocking layers between the third light emitting unit 14*c* and the first hole transport layer 131 as well as between the second light emitting unit 14*b* and the first hole transport layer 131 are saved, the luminescent chromaticity of the third light emitting region and the second light emitting region will decrease. Therefore, by increasing the thicknesses of the sixth electron blocking portion 16*f* of the third light emitting region and the fifth electron blocking portion 16*e* of the second light emitting region, the optical microcavity lengths of the red light emitting device and the green light emitting device are compensated, thereby reducing the risk of chromaticity decrease in the third light emitting region and in the second light emitting region.

Further, in order to better maintain the standard of the chromaticity of the luminous color of the third light emitting region and the second light emitting region, the thickness of the sixth electron blocking portion 16*f* is between 70 nanometers and 80 nanometers. For example, the thickness of the sixth electron blocking portion 16*f* can be 70 nanometers, 71 nanometers, 72 nanometers, 73 nanometers, or 73 nanometers, 74 nanometers, 75 nanometers, 76 nanometers, 77 nanometers, 78 nanometers, 79 nanometers or 80 nanometers, and the like. The thickness of the fifth electron blocking portion 16*e* is between 10 nanometers and 30 nanometers. For example, the thickness of the fifth electron blocking portion 16*e* can be 10 nanometers, 15 nanometers, 20 nanometers, 25 nanometers or 30 nanometers and the like.

Optionally, in one embodiment, the thickness of the first hole transport layer 131 is between 30 nanometers and 35 nanometers. For example, the thickness of the first hole transport layer 131 can be 30 nanometers, 31 nanometers, 32 nanometers, 33 nanometers, 34 nanometers, and 35 nanometers and the like. The thickness of the second hole transport layer 132 is between 20 nanometers and 25 nanometers. For example, the thickness of the second hole transport layer 132 can be 20 nanometers, 21 nanometers, 22 nanometers, 23 nanometers, 24 nanometers, and 25 nanometers and the like.

It can be understood that by increasing the thickness of the first hole transport layer 131, the light emitting positions of the third light emitting unit 14*c* to the fifth light emitting unit

14*e* will rise. Therefore, in order to avoid that light emitting positions of the sixth light emitting unit 14*f* and the fifth light emitting unit 14*e* deviate or rise too much, the thickness of the second hole transport layer 132 can be thinned to reduce the risk of the light emitting positions of the sixth light emitting unit 14*f* and the fifth light emitting unit 14*e* being deviated, thereby improving the luminous efficiency of the red light device and/or the green light device.

In addition, by adjusting the thicknesses of the first hole transport layer 131 and the second hole transport layer 132, the injection and transport of electrons and holes is adjusted, that is, the carrier balance is adjusted, so as to improve the luminous efficiency of the light emitting device.

Figure 4:
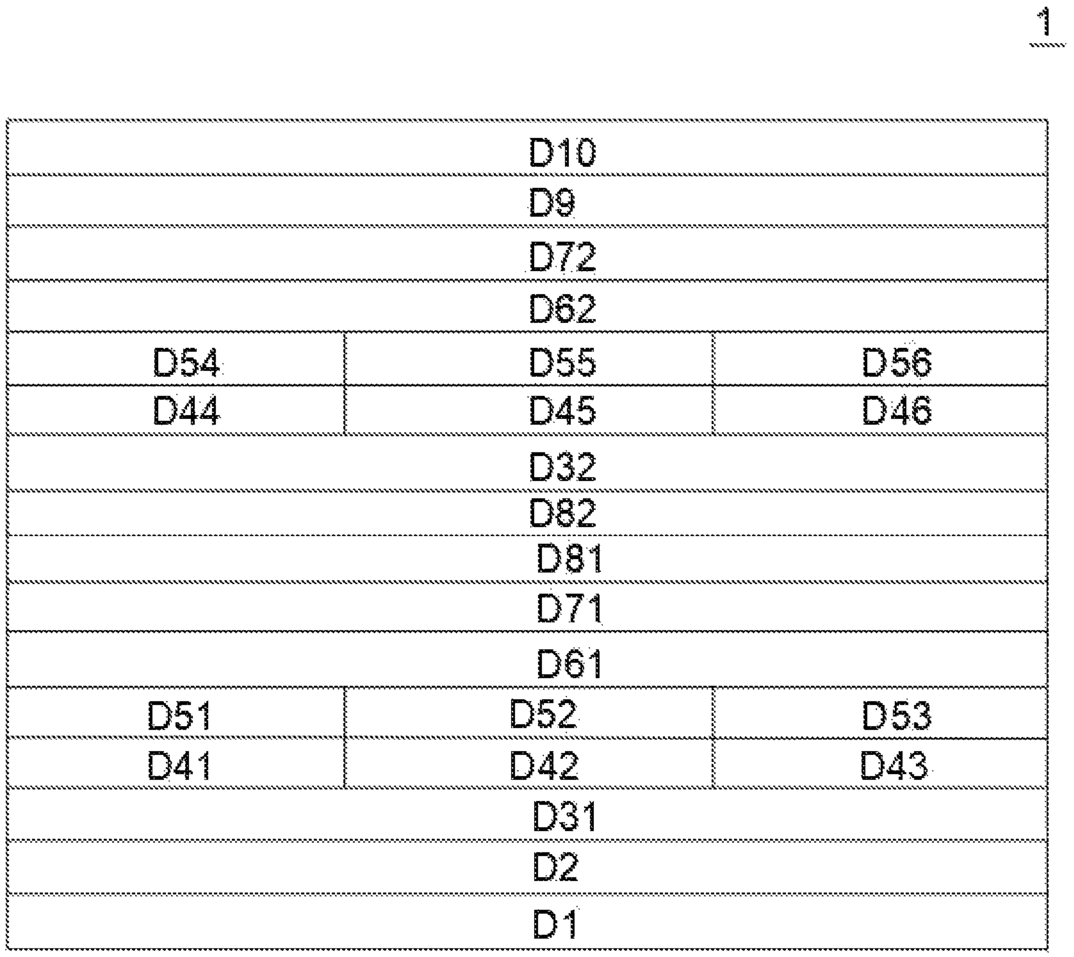
FIG. 4 is a schematic diagram of a structure of comparative example 1 in a comparative and simulating experiment.
Figure 5:
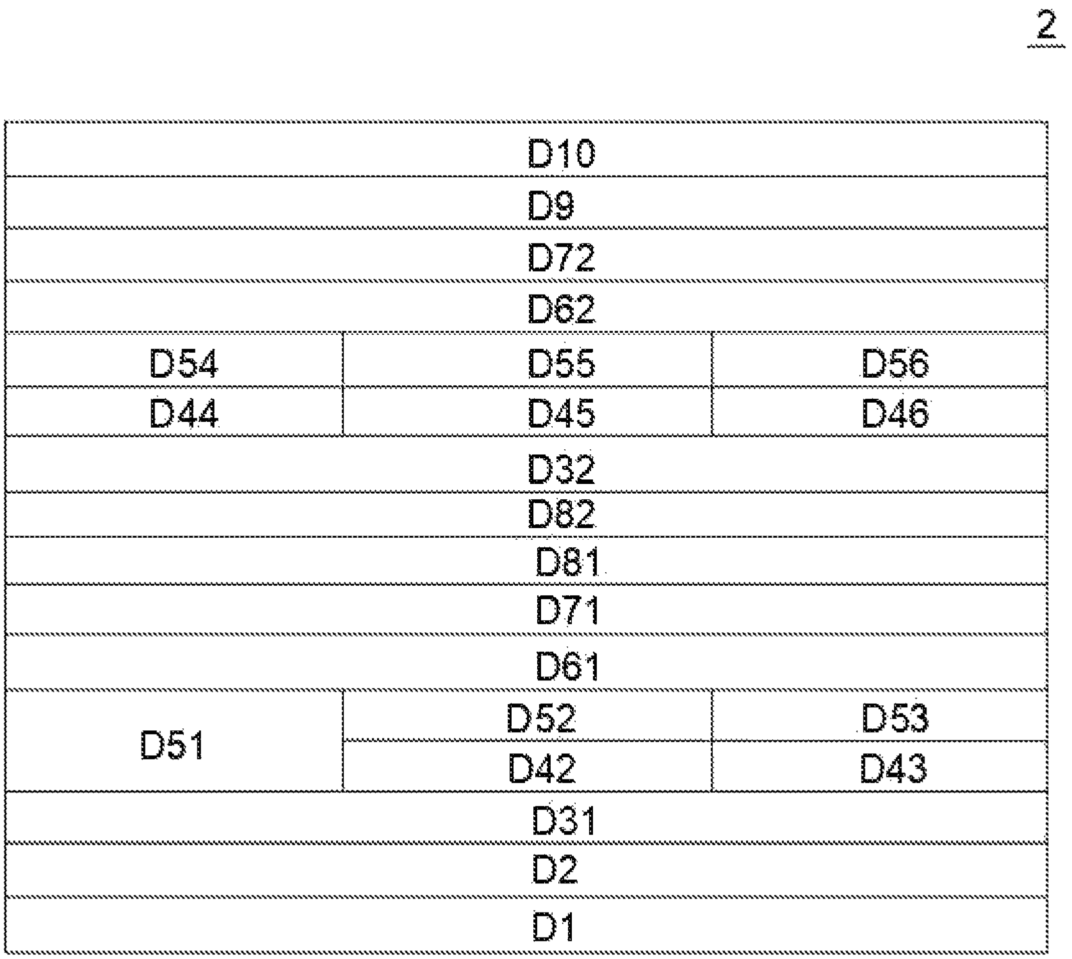
FIG. 5 is a schematic diagram of a structure of comparative example 2 in the comparative and simulating experiment.
Figure 6:
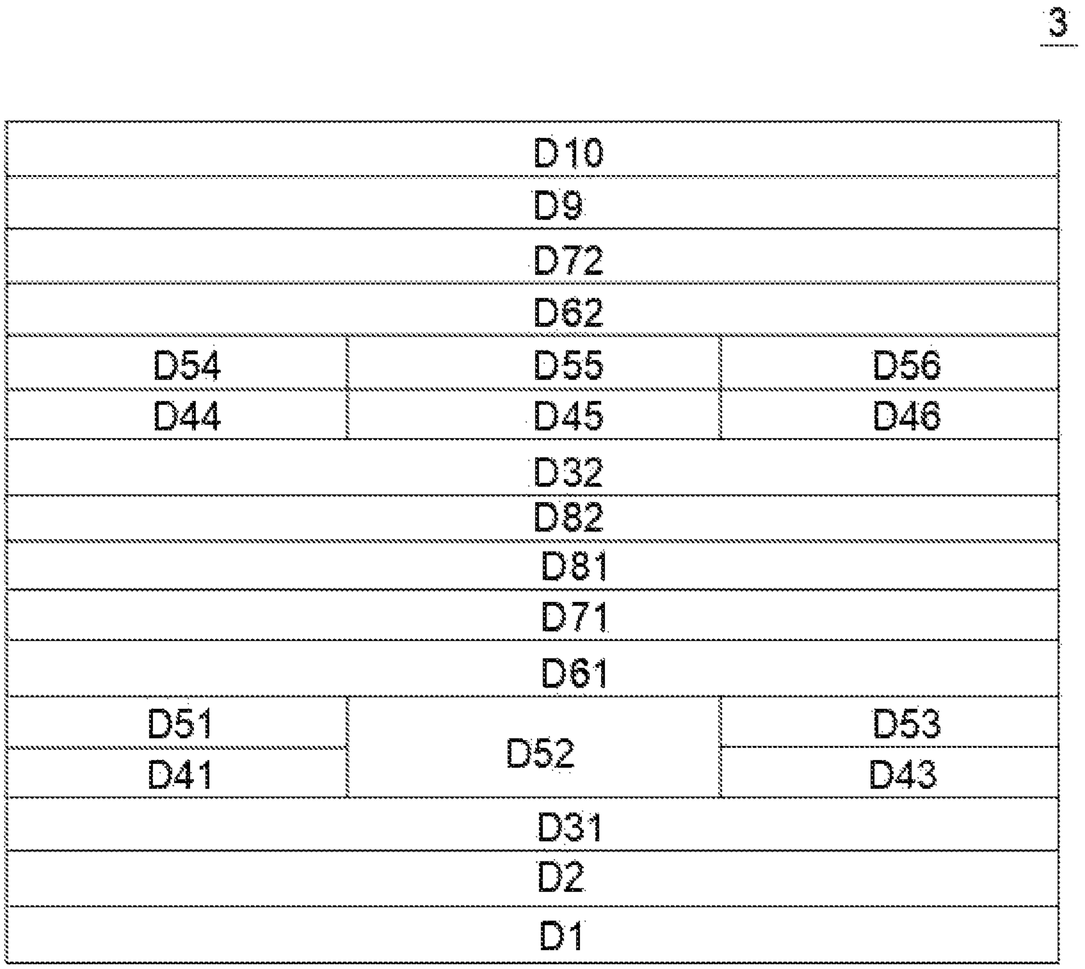
FIG. 6 is a schematic diagram of a structure of comparative example 3 in the comparative and simulating experiment.
Figure 7:
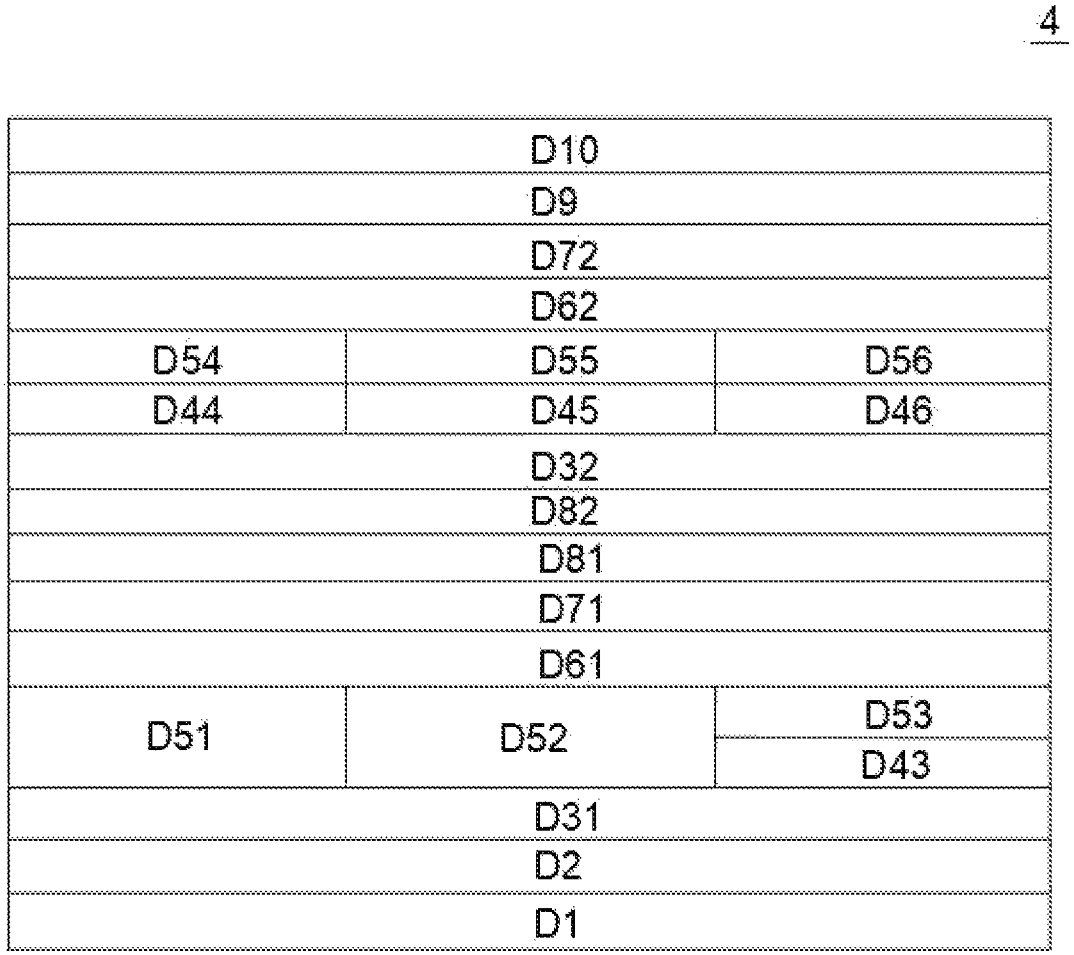
FIG. 7 is a schematic diagram of a structure of comparative example 4 in the comparative and simulating experiment.

In addition, the present disclosure designs a comparative and simulating experiment, the experiment is provided with comparative example 1, comparative example 2, comparative example 3, comparative example 4, embodiment 1 and embodiment 2. The comparative example 1 corresponds to the light emitting device 1 (as shown in FIG. 4), comparative example 2 corresponds to the light emitting device 2 (as shown in FIG. 5), comparative example 3 corresponds to the light emitting device 3 (as shown in FIG. 6), comparative Example 4 Corresponds to the light emitting device 4 (as shown in FIG. 7), embodiment 1 corresponds to the light emitting device 5, and embodiment 2 corresponds to the light emitting device 6.

In the light emitting device 1 of comparative example 1, the light emitting device 1 includes an anode layer D1, a hole injection layer D2, a first hole transport layer D31, a first electron blocking layer, a first light emitting layer, a first hole blocking layer D61, a first electron transport layer D71, an N-type charge generation layer D81, a P-type charge generation layer D82, a second hole transport layer D32, a second electron blocking layer, a second light emitting layer, a second hole blocking layer D62, a second electron transport layer D72, an electron injection layer D9 and a cathode layer D10 which are stacked in sequence.

The first electron blocking layer includes a first electron blocking portion D41, a second electron blocking portion D42, and a third electron blocking portion D43. The second electron blocking layer includes a fourth electron blocking portion D44 corresponding to the first electron blocking portion D41, a fifth electron blocking portion D45 corresponding to the second electron blocking portion D42, and a sixth electron blocking portion D46 corresponding to the third electron blocking portion D43.

The first light emitting layer includes a first red light emitting unit D51 corresponding to the first electron blocking portion D41, a first green light emitting unit D52 corresponding to the second electron blocking portion D42, and a first blue light emitting unit D53 corresponding to the third electron blocking portion D43. The second light emitting layer includes a second red light emitting unit D54 corresponding to the fourth electron blocking portion D44, a second green light emitting unit D55 corresponding to the fifth electron blocking portion D45, and a second blue light emitting unit D56 corresponding to the sixth electron blocking portion D46.

The anode layer D1 includes a plurality of anodes that are independent from each other, one anode corresponds to two stacked light emitting units.

It should be noted that the thickness of the hole transport layer 1 of the light emitting device 1 corresponding to comparative example 1 is 25 nanometers, and the thickness of the hole transport layer 2 is 30 nanometers. Compared with comparative example 1, the light emitting device 2 corresponding to comparative example 2 only saves the red electron blocking layer 1 and increases the thickness of the red electron blocking layer 2. Compared with comparative example 1, the light emitting device 3 corresponding to comparative example 3 only saves the green electron blocking layer 1 and increases the thickness of the green electron blocking layer 2. Compared with comparative example 1, the light emitting device 4 corresponding to comparative example 4 only saves the red electron blocking layer 1 and the green electron blocking layer 1, and increases the thicknesses of the red electron blocking layer 2 and the green electron blocking layer 2. Compared with comparative example 4, the light emitting device 5 corresponding to embodiment 1 only reduces the thickness of the hole transport layer 2 by 5 nanometers, and increases the thickness of the hole transport layer 1 by 5 nanometers. Compared with comparative example 4, the light emitting device 6 corresponding to embodiment 2 only reduces the thickness of the hole transport layer 2 by 10 nanometers, and increasing the thickness of the hole transport layer 1 by 10 nanometers.

Embodiment 1 and embodiment 2 are the embodiments shown in FIG. 3 of the present disclosure.

Based on the above six light emitting devices, the luminous efficiency of the red light device, the green light device and the blue light device corresponding to each light emitting device was measured, which is shown in the following table.

TABLE 1_sm_0001

| Classification | Device | Luminous efficiency of red light | Luminous efficiency of green light | Luminous efficiency of blue light |
|---|---|---|---|---|
| Comparative example 1 | Light emitting device 1 | 100% | 100% | 100% |
| Comparative example 2 | Light emitting device 2 | 97% | 100% | 100% |
| Comparative example 3 | Light emitting device 3 | 100% | 98% | 100% |
| Comparative example 4 | Light emitting device 4 | 97% | 98% | 100% |
| Embodiment 1 | Light emitting device 5 | 104% | 102% | 100% |
| Embodiment 2 | Light emitting device 6 | 105% | 103% | 101% |

According to the results of comparative example 2 to comparative example 4 in the above table, it can be seen that while saving the thickness of relevant electron blocking layer, only compensating the thickness of the electron blocking layer 2 of the corresponding color will still lead to the decrease in luminous efficiency.

According to the results of embodiment 1 and embodiment 2, it can be seen that by increasing the thickness of the hole transport layer 1 (the first hole transport layer 131) and reducing the thickness of the hole transport layer 2 (the second hole transport layer 132), the luminous efficiency of the red light device and the green light device of which the electron blocking layer 1 are saved is improved. Moreover, the increase in luminous efficiency of red light device is greater than that of green light device.

In addition, according to the results of embodiment 1 and embodiment 2, it can be seen that when the thickness of the hole transport layer 1 is increased to a certain extent, the luminous efficiency of blue light will also be improved.

An embodiment of the present disclosure further provides a display device including the display panel described in any of the above embodiments.

It should be noted that the structure of the display panel of the display device is similar or identical to the structure of the display panel 100 of any of the above embodiments, and therefore will not be described again herein.

Optionally, the display device can be at least one of a smartphone, a tablet personal computer, a mobile phone, a video phone, an e-book reader, or a desktop PC (personal computer), laptop PC, a netbook computer, a workstation, server, a personal digital assistant, a portable multimedia player, a MP3 (moving picture experts group audio layer III) player, a TV (television), a mobile medical device, a camera, a game console, a digital camera, a car navigation system, an electronic billboard, an ATM (automated teller machine) or a wearable device, a VR (virtual reality) device, and an AR (augmented reality) device.

The display panel of the embodiments of the present disclosure saves an electron blocking layer between at least one of the third light emitting unit and the first hole transport layer as well as the second light emitting unit and the first hole transport layer, by increasing the thickness of the first hole transport layer, while the decrease in luminous efficiency of the light emitting devices corresponding to the second light emitting unit and/or the third light emitting unit is avoided, masks can be saved and process steps can be simplified.

The display panel and display device provided by the embodiments of the present disclosure are introduced in detail in the above, and specific examples are used herein to illustrate the principles and implementations of the present disclosure. The description of the above embodiments is only intended to help to understand methods and core ideas of the present disclosure. At the same time, for those skilled in the art, there will be changes in specific implementations and application scope based on the ideas of the present disclosure. In summary, the content of this description should not be understood as a limitation of the present disclosure.

What is claimed is:

1. A display panel comprising:

a substrate;

a first conductive layer disposed on the substrate, wherein the first conductive layer comprises a plurality of first electrodes, a plurality of second electrodes, and a plurality of third electrodes;

a first hole transport layer disposed on the first conductive layer;

a first electron blocking layer disposed on the first hole transport layer, wherein the first electron blocking layer comprises: a first electron blocking portion disposed corresponding to the plurality of first electrodes;

a first light emitting layer disposed on the first electron blocking layer, wherein the first light emitting layer comprises: a first light emitting unit disposed corresponding to the plurality of first electrodes, a second light emitting unit disposed corresponding to the plurality of second electrodes, and a third light emitting unit disposed corresponding to the plurality of third electrodes;

a charge generation layer disposed on the first light emitting layer;

a second hole transport layer disposed on the charge generation layer, wherein a thickness of the second hole transport layer is less than a thickness of the first hole transport layer;

a second electron blocking layer disposed on the second hole transport layer, wherein the second electron blocking layer comprises: a fourth electron blocking portion disposed corresponding to the plurality of first electrodes, a fifth electron blocking portion disposed corresponding to the plurality of second electrodes, and a sixth electron blocking portion disposed corresponding to the plurality of third electrodes;

a second light emitting layer disposed on the second electron blocking layer, wherein the second light emitting layer comprises: a fourth light emitting unit disposed corresponding to the plurality of first electrodes, a fifth light emitting unit disposed corresponding to the plurality of second electrodes, and a sixth light emitting unit disposed corresponding to the plurality of third electrodes; and a second conductive layer disposed on the second light emitting layer;

wherein a side surface of the first hole transport layer away from the substrate is in direct contact with at least one of the second light emitting unit and the third light emitting unit.

2. The display panel according to claim 1, wherein an area of the first light emitting unit is greater than an area of the second light emitting unit and an area of the third light emitting unit.

3. The display panel according to claim 2, wherein each of the first light emitting unit and the fourth light emitting unit displays a first color, each of the second light emitting unit and the fifth light emitting unit displays a second color, each of the third light emitting unit and the sixth light emitting unit displays a third color, and the first color, the second color, and the third color are different from each other.

4. The display panel according to claim 3, wherein the third light emitting unit and the sixth light emitting unit are configured to emit red light, the second light emitting unit and the fifth light emitting unit are configured to emit green light, and a thickness of the fifth electron blocking portion is greater than or equal to 10 nanometers.

5. The display panel according to claim 2, wherein a third electron blocking portion is disposed between the third light emitting unit and the first hole transport layer, and the second light emitting unit is in direct contact with the side surface of the first hole transport layer away from the substrate.

6. The display panel according claim 2, wherein a second electron blocking portion is disposed between the second light emitting unit and the first hole transport layer, and the third light emitting unit is in direct contact with the side surface of the first hole transport layer away from the substrate.

7. The display panel according to claim 6, wherein the third light emitting unit and the sixth light emitting unit are configured to emit red light, the second light emitting unit and the fifth light emitting unit are configured to emit green light, and a thickness of the sixth electron blocking portion is greater than or equal to 50 nanometers.

8. The display panel according to claim 2, wherein each of the third light emitting unit and the second light emitting unit is in direct contact with the side surface of the first hole transport layer away from the substrate.

9. The display panel according to claim 8, wherein the third light emitting unit and the sixth light emitting unit are configured to emit red light, the second light emitting unit and the fifth light emitting unit are configured to emit green light, a thickness of the sixth electron blocking portion is greater than or equal to 50 nanometers, and a thickness of the fifth electron blocking portion is greater than or equal to 10 nanometers.

10. The display panel according to claim 1, wherein the thickness of the first hole transport layer is between 30 nanometers and 35 nanometers, and the thickness of the second hole transport layer is between 20 nanometers and 25 nanometers.

11. The display panel according to claim 1, wherein the charge generation layer comprises an N-type charge generation layer and a P-type charge generation layer that are disposed on the first light emitting layer in sequence, the P-type charge generation layer comprises an organic material with hole transport capability and a first doping material, the first doping material is selected from at least one of a metal oxide and an organic material with electron withdrawing property, and a weight percentage of the first doping material in the P-type charge generation layer is between 0.1% and 20%.

12. The display panel according to claim 11, wherein the weight percentage of the first doping material in the P-type charge generation layer is between 3% and 13%, and a thickness of the P-type charge generation layer is between 5 nanometers and 50 nanometers.

13. The display panel according to claim 11, wherein the N-type charge generation layer comprises an organic material with electron transport capability and a second doping material, the second doping material is selected from at least one of a metal material and a metal salt material, and a weight percentage of the second doping material in the N-type charge generation layer is between 0.1% and 20%.

14. The display panel according to claim 13, wherein the weight percentage of the second doping material in the N-type charge generation layer is between 0.1% and 10%, and a thickness of the N-type charge generation layer is between 5 nanometers and 50 nanometers.

15. A display device comprising a display panel, wherein the display panel comprises:

a substrate;

a first conductive layer disposed on the substrate, wherein the first conductive layer comprises a plurality of first electrodes, a plurality of second electrodes, and a plurality of third electrodes;

a first hole transport layer disposed on the first conductive layer;

a first electron blocking layer disposed on the first hole transport layer, wherein the first electron blocking layer includes: a first electron blocking portion disposed corresponding to the plurality of first electrodes;

a first light emitting layer disposed on the first electron blocking layer, wherein the first light emitting layer comprises: a first light emitting unit disposed corresponding to the plurality of first electrodes, a second light emitting unit disposed corresponding to the plurality of second electrodes, and a third light emitting unit disposed corresponding to the plurality of third electrodes;

a charge generation layer disposed on the first light emitting layer;

a second hole transport layer disposed on the charge generation layer, wherein a thickness of the second hole transport layer is less than a thickness of the first hole transport layer;

a second electron blocking layer disposed on the second hole transport layer, wherein the second electron blocking layer comprises: a fourth electron blocking portion disposed corresponding to the plurality of first electrodes, a fifth electron blocking portion disposed corresponding to the plurality of second electrodes, and a sixth electron blocking portion disposed corresponding to the plurality of third electrodes;

a second light emitting layer disposed on the second electron blocking layer, wherein the second light emitting layer comprises: a fourth light emitting unit disposed corresponding to the plurality of first electrodes, a fifth light emitting unit disposed corresponding to the plurality of second electrodes, and a sixth light emitting unit disposed corresponding to the plurality of third electrodes;

a second conductive layer disposed on the second light emitting layer;

wherein a side surface of the first hole transport layer away from the substrate is in direct contact with at least one of the second light emitting unit and the third light emitting unit.

16. The display device according to claim 15, wherein an area of the first light emitting unit is greater than an area of the second light emitting unit and an area of the third light emitting unit.

17. The display device according to claim 16, wherein each of the first light emitting unit and the fourth light emitting unit displays a first color, each of the second light emitting unit and the fifth light emitting unit displays a second color, each of the third light emitting unit and the sixth light emitting unit displays a third color, and the first color, the second color, and the third color are different from each other.

18. The display device according to claim 17, wherein the third light emitting unit and the sixth light emitting unit are configured to emit red light, the second light emitting unit and the fifth light emitting unit are configured to emit green light, and a thickness of the fifth electron blocking portion is greater than or equal to 10 nanometers.

19. The display device according to claim 16, wherein a third electron blocking portion is disposed between the third light emitting unit and the first hole transport layer, and the second light emitting unit is in direct contact with the side surface of the first hole transport layer away from the substrate.

20. The display device according to claim 16, wherein a second electron blocking portion is disposed between the second light emitting unit and the first hole transport layer, and the third light emitting unit is in direct contact with the side surface of the first hole transport layer away from the substrate.

* * * * *